(12) United States Patent
Park et al.

(10) Patent No.: US 8,883,622 B2
(45) Date of Patent: Nov. 11, 2014

(54) METHOD OF FABRICATING AND SEMICONDUCTOR MEMORY DEVICE USING THE SAME

(75) Inventors: Won-mo Park, Seongnam-si (KR); Min-wk Hwang, Yongin-si (KR); Hyun-chul Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/414,262

(22) Filed: Mar. 7, 2012

(65) Prior Publication Data
US 2012/0231619 A1 Sep. 13, 2012

(30) Foreign Application Priority Data

Mar. 8, 2011 (KR) .......................... 10-2011-0020621

(51) Int. Cl.
| | |
|---|---|
| *H01L 21/283* | (2006.01) |
| *H01L 27/108* | (2006.01) |
| *G11C 5/04* | (2006.01) |
| *H01L 21/768* | (2006.01) |
| *G11C 5/06* | (2006.01) |

(52) U.S. Cl.
CPC ............ *H01L 21/76885* (2013.01); *G11C 5/04* (2013.01); *H01L 27/10894* (2013.01); *H01L 27/10897* (2013.01); *G11C 5/06* (2013.01)
USPC ............ 438/586; 438/585; 438/397; 257/296

(58) Field of Classification Search
USPC .......................... 438/586, 585, 397; 257/296
See application file for complete search history.

(56) References Cited

U.S. PATENT DOCUMENTS

| | | | | |
|---|---|---|---|---|
| 6,350,650 B1 * | 2/2002 | Lee | ............................... | 438/256 |
| 6,785,157 B2 * | 8/2004 | Arimoto et al. | ................ | 365/149 |
| 7,265,580 B2 * | 9/2007 | Sugawara et al. | ................ | 326/47 |
| 7,462,912 B2 * | 12/2008 | Ahn et al. | ...................... | 257/334 |
| 7,601,630 B2 * | 10/2009 | Park et al. | ...................... | 438/620 |
| 2006/0211196 A1 * | 9/2006 | Tanaka et al. | .................. | 438/243 |
| 2010/0025749 A1 * | 2/2010 | Yoo et al. | ....................... | 257/306 |

* cited by examiner

*Primary Examiner* — Zandra Smith
*Assistant Examiner* — Damian A Hillman
(74) *Attorney, Agent, or Firm* — Onello & Mello, LLP

(57) ABSTRACT

A method of fabricating a semiconductor memory device includes preparing a semiconductor substrate which is divided into a cell array region and a core and peripheral region adjacent to the cell array region. Signal lines may be formed in a lower layer in a cell region. An insulation layer may be formed on the lower layer. Signal lines connected to cell region signal lines may be formed on an insulation layer of the peripheral region. A capping layer may be formed on the insulation layer and the core and peripheral signal lines. The capping layer may be etched to expose the lower layer of the cell array region and an etch stop may be formed on the lower layer and the core and peripheral region.

20 Claims, 13 Drawing Sheets

METHOD OF FABRICATING AND SEMICONDUCTOR MEMORY DEVICE USING THE SAME

CROSS-REFERENCE TO RELATED APPLICATIONS

This application claims the benefit of Korean Patent Application No. 10-2011-0020621, filed on Mar. 8, 2011, in the Korean Intellectual Property Office, the disclosure of which is incorporated herein in its entirety by reference.

BACKGROUND

Inventive concepts relate to a method of fabricating semiconductor memory devices, and more particularly, to a method of fabricating semiconductor memory devices in which a capacitor is formed in a cell array region and a signal transmission conductive layer (also referred to herein as an interconnect layer or interconnect pattern) is formed in core and peripheral regions (also referred to herein as peripheral regions).

A semiconductor memory device may be divided into a cell array region and a core/peripheral region (also referred to herein, simply, as "peripheral region"). Memory cells may be formed in an array, such as a crosspoint matrix, for example. Circuit elements that route data between memory cells and external circuit elements may be formed in regions referred to as peripheral or core regions. Differences in functionality and structure between regular arrays of memory cells and the potentially more complex peripheral circuitry can complicate the process of forming memory cells and peripheral circuitry on the same integrated circuit, particularly as integrated circuit memories become more complex and compact. A process that simplifies the formation of integrated circuit memory cells would, therefore, be highly desirable.

SUMMARY

A method in accordance with inventive concepts simplifies the process of fabricating a semiconductor memory device.

According to an aspect of inventive concepts, there is provided a method fabricating a semiconductor memory device includes: preparing a semiconductor substrate which is divided into a cell array region and a peripheral region adjacent to the cell array region and comprises a lower layer where a cell array signal transmission conductive layer is formed in the cell array region; forming an insulation layer on the whole of the lower layer; forming a core and peripheral signal transmission conductive layer which is electrically connected to the cell array signal transmission conductive layer, on the insulation layer of the peripheral region; forming a capping insulation film (also referred to herein as a capping layer) on the insulation layer and the core and peripheral signal transmission conductive layer; etching the capping layer so that the lower layer of the cell array region is exposed; and forming a stopper layer (also referred to herein as an etch stop) on the whole surface of the lower layer and the peripheral region.

According to another aspect in accordance with inventive concepts, a capping layer may be formed to have a thickness corresponding to at least one half of an interval between the core and peripheral signal transmission conductive layer.

According to another aspect in accordance with inventive concepts, the etching of the capping layer may include dry etching.

According to another aspect in accordance with inventive concepts, a cell array signal transmission conductive layer may include a cell array bit line, and the core and peripheral signal transmission conductive layer may include a core and peripheral bit line.

According to another aspect in accordance with inventive concepts, the cell array signal transmission conductive layer may include a cell array word line, and the core and peripheral signal transmission conductive layer may include a core and peripheral word line.

According to another aspect in accordance with inventive concepts, forming of the core and peripheral signal transmission conductive layer may include forming a contact plug electrically connected to the cell array signal transmission conductive layer.

According to another aspect in accordance with inventive concepts, the lower layer may include an interlayer insulation layer.

According to another aspect in accordance with inventive concepts, the lower layer may be formed on the semiconductor substrate.

According to another aspect in accordance with inventive concepts, the lower layer may be formed so that an upper surface of the lower layer has a first height level, and stretches over the cell region and the peripheral region.

According to another aspect in accordance with inventive concepts, the cell array signal transmission conductive layer may be formed at a location under the first height level.

According to another aspect in accordance with inventive concepts, the method may further include: forming an insulation mold layer on the etch stop after the forming of the etch stop; and forming a storage electrode which is electrically connected to the lower layer by passing through the insulation mold layer and the etch stop.

According to another aspect in accordance with inventive concepts, the lower layer may include a buried contact layer, and the storage electrode may be electrically connected to the buried contact layer.

According to another aspect in accordance with inventive concepts, the buried contact layer may include poly-silicon.

According to another aspect in accordance with inventive concepts, the method may further include, after the forming of the insulation mold layer, forming a photoresist pattern on the insulation mold layer before forming the storage electrode.

According to another aspect in accordance with inventive concepts, the insulation mold layer may include a material whose etching selection ratio is larger than that of the etch stop.

In exemplary embodiments in accordance with inventive concepts, a method of forming a semiconductor memory device having cell and peripheral regions, may include: forming an insulation layer over cell and peripheral regions, then forming upper signal lines on the insulation layer in a peripheral region. A capping layer may then be formed over cell and peripheral regions. The memory device may then be etched to form spacers on sidewalls of upper signal lines and to remove capping and insulation layers in the cell region, thereby exposing a lower layer in the cell region for further processing.

In another aspect in accordance with inventive concepts, the capping layer may include an oxide or a nitride, such as silicon nitride, for example.

In another aspect in accordance with inventive concepts, the capping layer may be deposited to a thickness that is equal to at least half the distance between upper signal lines.

In another aspect in accordance with inventive concepts, an etch stop layer may be formed over upper signal lines after formation of spacers on sidewalls of upper signal lines.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1A:
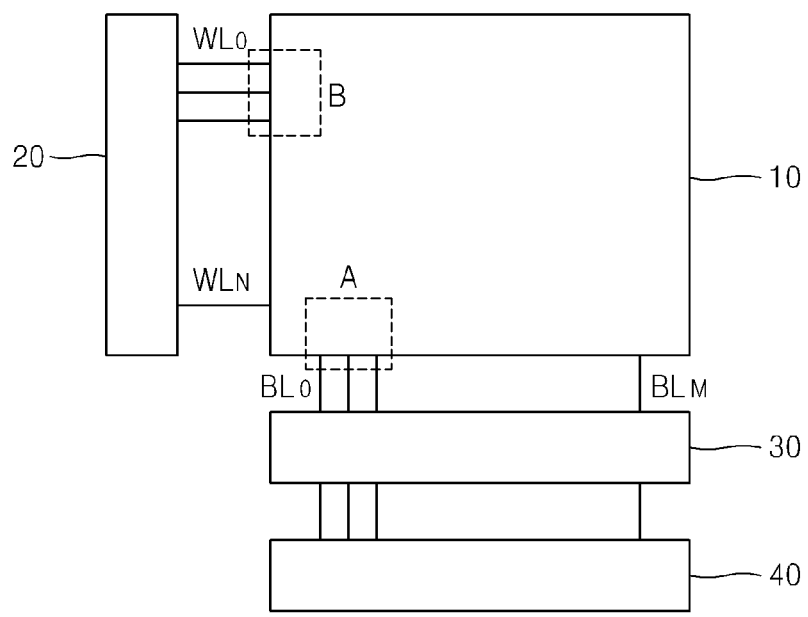
FIG. 1A is a block diagram of a semiconductor memory device fabricated in accordance with principles of inventive concepts.

Exemplary embodiments of the inventive concept will now be described more fully with reference to the accompanying drawings, in which exemplary embodiments of the inventive concept are shown. Exemplary embodiments of the inventive concept may, however, be embodied in many different forms and should not be construed as limited to the embodiments set forth herein; rather, these exemplary embodiments of the inventive concept are provided so that this description will be thorough and complete, and will fully convey the concept of exemplary embodiments of the inventive concept to those of ordinary skill in the art. In the drawings, the thicknesses of layers and regions are exaggerated for clarity. Like reference numerals in the drawings denote like elements, and thus their description will be omitted.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath," "below," "lower," "above," "upper," "top," "bottom," "vertical," "horizontal," "side," "left," "right," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated, for example, 90 degrees or at other orientations) and the spatially relative descriptors used herein interpreted accordingly.

The terminology used herein is for the purpose of describing particular exemplary embodiments of the inventive concept only and is not intended to be limiting of the inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments of the inventive concept are described herein with reference to cross-sectional illustrations that are schematic illustrations of idealized exemplary embodiments of the inventive concept (and intermediate structures). As such, variations from the shapes of the illustrations as a result, for example, of manufacturing techniques and/or tolerances, are to be expected. Thus, exemplary embodiments of the inventive concept should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept. Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1B:
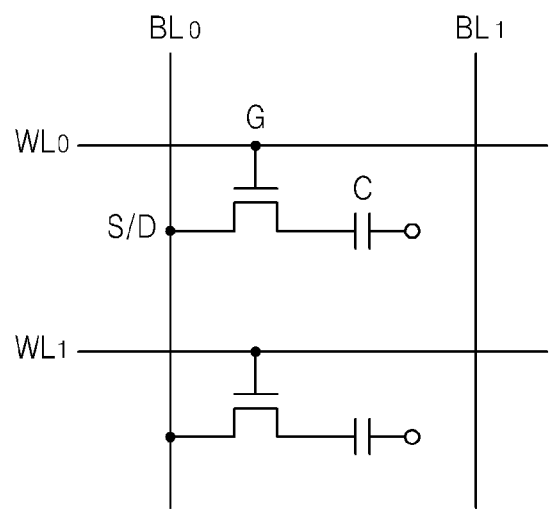
FIG. 1B is a schematic circuit diagram illustrating an exemplary embodiment of a semiconductor memory cell in a cell array region of FIG. 1A.

FIG. 1A is a block diagram of a semiconductor memory device fabricated according to an exemplary embodiment in accordance with principles of inventive concepts. FIG. 1B is a schematic circuit diagram illustrating a semiconductor memory cell in a cell array region of FIG. 1A.

Inventive concepts may be applied, for example, to semiconductor memory devices whose cells include at least one transistor and one capacitor for storing data. Referring to FIGS. 1A and 1B, semiconductor memory device according to an exemplary embodiment in accordance with principles of inventive concepts includes a cell array region 10 in which unit memory cells for storing data are arranged in a matrix form. A peripheral circuit which transfers data between memory cells in cell array region 10 and external circuits may be formed in a peripheral region formed around and adjacent to cell array region 10.

In this exemplary embodiment, cell array region 10 includes a plurality of memory cells, word lines $WL_0 \ldots WL_N$ and bit lines $BL_0 \ldots BL_M$. In exemplary embodiments, word lines $WL_0 \ldots WL_N$ and bit lines $BL_0 \ldots BL_M$ access memory cells (that is, select and activate) memory cells and transfer data to and from accessed memory cells.

In the schematic circuit diagram of FIG. 1B a unit memory cell in accordance with principles of inventive concepts may be formed as a one-transistor dynamic random access memory (1-T DRAM), which includes one transistor, referred to as a cell transistor, and one capacitor C, referred to as a cell capacitor. In an exemplary embodiment, data stored in a unit memory cell is logic "1" when capacitor C is charged, and is logic "0" when capacitor C is discharged. An electrode of capacitor C may be connected to a first source/drain S/D (that is, a first source or drain), of a cell transistor, and another electrode of capacitor C may be connected to a voltage reference, such as "common" or "ground," for example. In an exemplary embodiment, word line $WL_0$ may be connected to a gate G of a cell transistor, and bit line $BL_0$ may be connected to a second source/drain S/D of the cell transistor. With word line $WL_0$ connected to a gate of cell transistor, word line $WL_0$ controls the "ON/OFF" state of a cell transistor, connecting an electrode of cell capacitor C to bit line $BL_o$ when "ON," and disconnecting an electrode of cell capacitor C from bit line $BL_0$ when "OFF."

As illustrated in an exemplary embodiment in accordance with principles of inventive concepts of FIG. 1A, a row decoder 20 for selecting one of the word lines $WL_0 \ldots WL_N$ and a column decoder 40 for selecting one of the bit lines $BL_0 \ldots BL_M$ may be formed in a peripheral region around the cell array region 10. In this exemplary embodiment, sense amplifier 30 senses signals of the bit lines $BL_0 \ldots BL_M$, amplifies sensed signals, and transmits amplified signals to an external circuit. In the exemplary embodiment of FIG. 1A, a reference symbol "A" highlights a boundary region between the bit lines $BL_0 \ldots BL_M$ and cell array region 10, and a reference symbol "B" highlights a boundary region between word lines $WL_0 \ldots WL_N$ and the cell array region 10.

Figure 2:
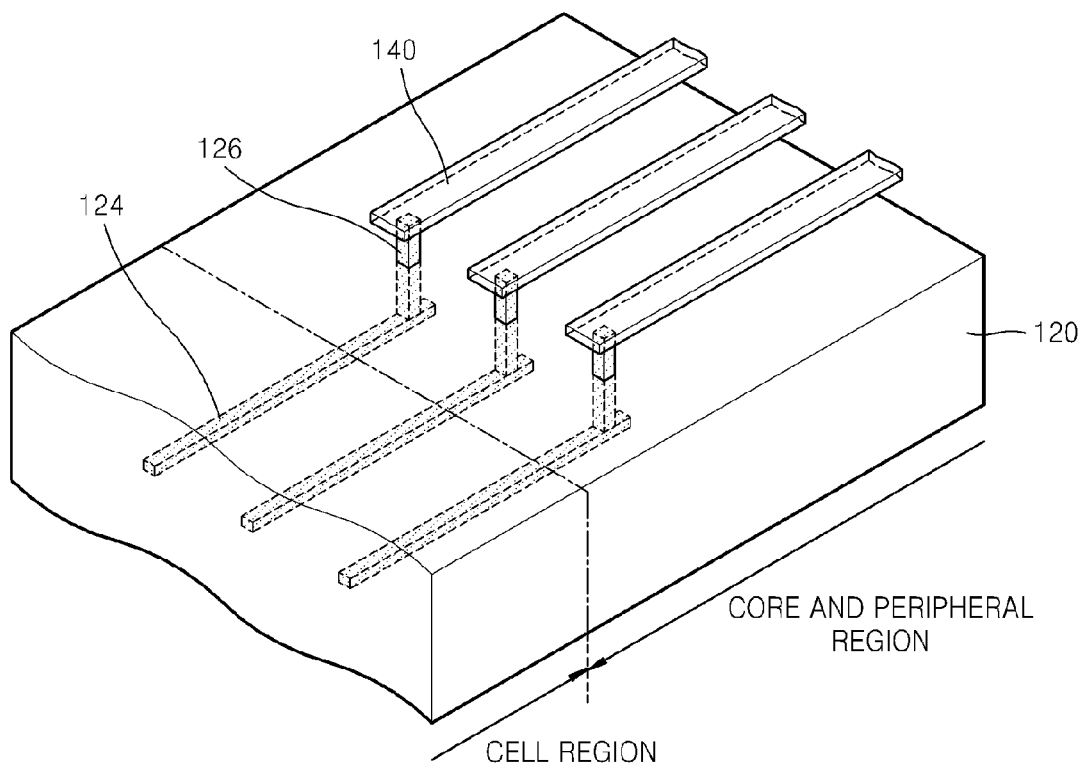
FIG. 2 is a perspective view illustrating an arrangement of bit lines in accordance with principles of inventive concepts.

FIG. 2 is a perspective view illustrating an exemplary arrangement of signal transmission conductive layers 124 and 140 in an integrated memory device in accordance with principles of inventive concepts. Signal transmission conductive layers 124 and 140 may also be referred to herein as interconnect layers or patterns, or, respectively, "buried" and "upper" signal lines for example. Buried signal lines 124 and upper signal lines 140 may represent bit lines in boundary region "A" of FIG. 1A, for example.

In the exemplary embodiment of FIG. 2, a lower layer 120, which may be an insulation layer including silicon dioxide, for example, may be formed on a semiconductor substrate. In an exemplary embodiment in accordance with principles of inventive concepts, lower layer 120 may encompass cell region 10 and extend beyond, to a peripheral region. In cell region 10 buried bit line conductors 124 may be arranged in spaced-apart parallel lines buried in layer 120. In an exemplary embodiment in accordance with principles of inventive concepts, buried signal lines 124 may make electrical contact with source/drains of cell transistors, as illustrated by bit line BL0 making contact with second S/D of cell transistor in FIG. 1B. Buried bit line conductors 124 may extend beyond cell region 10 into peripheral region, for example. Upper signal lines 140 may be spaced apart parallel conductive lines formed on an upper surface of layer 120 and may be aligned with corresponding buried signal lines 124, for example. Buried signal lines 124 and upper signal lines 140 may be connected through contact plugs 126. Although formed in peripheral region in this exemplary embodiment, contact plugs may be formed in cell region 10. In accordance with principles of inventive concepts, whether in cell region or in core/peripheral region, buried signal lines 124 and upper signal lines 140 make contact with each other through contact plugs 126 within a border region between cell region 10 and core/peripheral region, such as border region A of FIG. 1A. Although illustrated as such in FIG. 2, upper signal lines 140 need not extend in the same direction as buried signal lines 124.

In exemplary embodiments in accordance with the principles of inventive concepts, cell array signal transmission conductive layers 124, or, simply, buried signal lines 124, may include metal, metal nitride, metal silicide, or a compound thereof. For example, buried bit lines 124 may include metal such as tungsten (W), aluminum (Al), copper (Cu), molybdenum (Mo), titanium (Ti), tantalryum (Ta), or Ruthenium (Ru), may include metal nitride such as TiN, TiN/W, Ti/TiN, WN, W/WN, TaN, Ta/TaN, TiSiN, TaSiN, or WSiN (here, N means nitride, and Si means silicide.), or may include metal silicide such as $CoSi_2$, $TiSi_2$, or $WSi_2$, for example.

Figure 3:
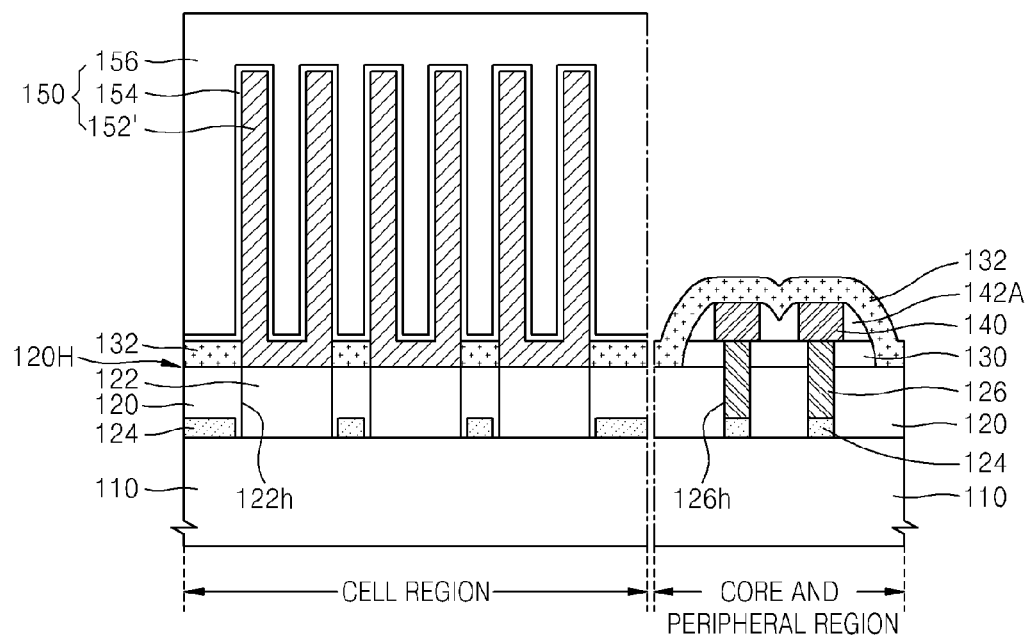
FIG. 3 is a partial cross-sectional view illustrating a semiconductor memory device fabricated in accordance with principles of inventive concepts.

FIG. 3 is a partial cross-sectional view of an exemplary embodiment of a semiconductor memory, including buried signal lines 124 and upper signal lines 140, fabricated in accordance with principles of inventive concepts. In an exemplary embodiment, lower layer 120 is formed on a semiconductor substrate 110, which may be a silicon substrate, for example. In exemplary embodiments, lower layer 120, which may be an insulation layer including a silicon oxide film, may extend over cell region 10 and peripheral region, to a height of 120H (also referred to herein as "a first height"), for example.

As shown in the exemplary embodiment of FIG. 2, buried signal lines 124 may be buried in lower layer 120. A buried contact 122 may be formed, for example, with a poly-silicon material, in a location where a storage electrode 152' of a capacitor 150 is formed. In an exemplary embodiment in accordance with principles of inventive concepts, buried contact 122 may be electrically connected to a first source/drain (not shown) of a cell transistor (that is, to a cell transistor source/drain not connected to a bit line) formed in the cell region.

In an exemplary embodiment, capacitor 150 may be faulted at the same level as buried contact 122, on lower layer 120 of the cell region. In an exemplary embodiment, capacitor 150 includes a storage electrode 152', a capacitor dielectric layer 154, and a plate electrode 156. Storage electrode 152' of capacitor 150 may be electrically connected to buried contact 122 by passing through a stopper layer 132, also referred to herein as etch stop layer 132, and an insulation mold layer 134 (refer to FIG. 4E), formed on the lower layer 120.

In an exemplary embodiment in accordance with inventive principles, capacitor 150 may have a concave shape, with capacitor dielectric layer 154 formed along external lateral sides, upper sides, internal lateral sides, and bottom sides of the concave shape of storage electrode 152'.

Upper bit lines 140 may be formed, as will be described in greater detail in the discussion related to upcoming figures, at a level above the upper surface of the lower layer 120. Upper bit lines 140 may be electrically connected to buried signal lines 124 extending from the cell region, through contact plugs 126, which may also be referred to herein as "direct contacts." Contact plugs 126 may be formed by forming a barrier metal layer of titanium or titanium nitride, for example, inside a contact hole 126h and thereafter filling the contact hole 126h with the same material as that of upper signal lines 140 (for example, tungsten).

Spacers 142A may be formed on sidewalls of upper signal lines 140 by forming a capping layer 142 (refer to FIG. 4B) on the insulation layer 130, then etching the capping layer 142. The etching process may be a dry etching process, and the capping layer 142 may include an oxide or a nitride such as silicon nitride, for example. In exemplary embodiments in accordance with inventive principles, spacers reduce the step height (that is, the difference in height) between cell and peripheral regions. Additionally, exposing lower layer 120 of cell region while etching capping layer 142 (and insulation layer 130 in cell region) to form spacers 142a opens cell region 120 for further processing, thereby simplifying a fabrication process.

In exemplary embodiments in accordance with inventive concepts capping layer 142 may include an oxide or a nitride such as silicon nitride, for example. Capping layer may be deposited to a thickness that ensures no void, or crease, is established in the capping insulation. That is, a void, or crease, may be formed in capping insulation between upper signal lines 140 if insufficient capping insulation material is deposited on insulation layer 130. In exemplary embodiments in accordance with inventive concepts, capping material may be deposited to a thickness that is greater than or equal to half the distance between upper signal lines 140, thereby ensuring that the gap between upper signal lines 140 is filled with capping insulation material.

An etch stop layer 132 may be formed atop a wafer, including lower layer 120 and peripheral region. Etch stop layer 132 may include silicon nitride material and may be formed by using chemical vapor deposition (CVD), for example. Etch stop layer 132 may protect upper signal lines 140 in a peripheral region during formation of capacitor 150 in cell region, for example.

An exemplary process of fabricating a semiconductor memory in accordance with principles of inventive concepts will be described in reference to cross-sectional views of FIGS. 4A through 4G.

Figure 4A:
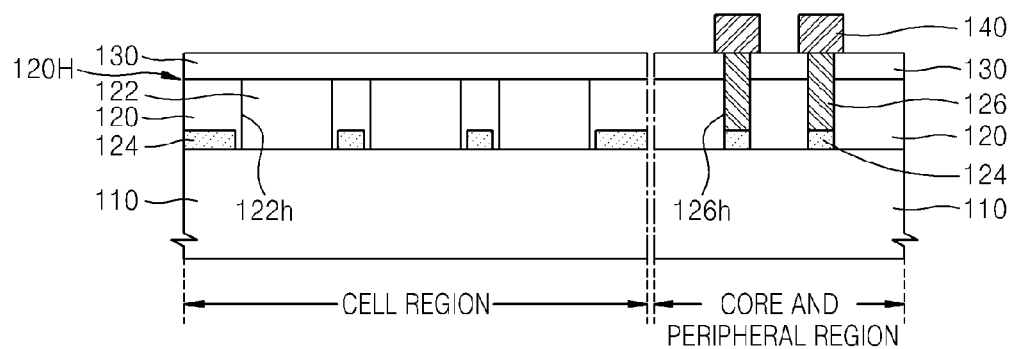
FIGS. 4A through 4G are cross-sectional views illustrating an exemplary process of fabricating semiconductor memory device of FIG. 3 in accordance with principles of inventive concepts.

Referring to FIG. 4A, cell array buried signal lines 124 may be produced by forming a layer of conductive material such as cobalt, nickel, and/or titanium on semiconductor substrate 110 and then patterning the conductive material. Semiconductor substrate 110 may be a silicon substrate in which cell transistors are formed in a cell region, for example. In exemplary embodiments in which buried signal lines 124 and upper bit lines are connected through a contact plug 126 located in core peripheral region, cell array buried signal lines 124 may extend into peripheral region. In exemplary embodiments in which buried signal lines 124 and upper bit lines are connected through a contact plug 126 located in cell region, cell array buried signal lines 124 need not extend into peripheral region.

After producing buried signal lines 124, lower layer 120, which may be an interlayer dielectric layer, may be formed on semiconductor substrate 110, covering the entire substrate 110 including cell and peripheral regions, for example. Lower layer 120 may include silicon oxide or silicon nitride, for example. After forming lower layer 120, the upper surface of lower layer 120 may be planarized using an etch-back process or chemical mechanical polishing (CMP), for example.

After planarizing the upper surface of lower layer 120, buried contact holes 122h may be formed in lower layer 120 by etching down to a top surface of semiconductor substrate 110. A mask pattern which defines the locations of buried contacts 122 may be employed as an etching mask in such a process. Material for buried contacts 122 (for example, doped poly-silicon), may then be layered over the entire lower surface 120, thereby filling buried contact holes 122h with buried contact material. A subsequent planarization, using CMP, for example, may separate buried contacts 122 from one another.

After planarization, an insulation layer 130, which may include an oxide or nitride, may be deposited over the entire surface of the planarized lower layer 120. Then, insulation layer 130 may be planarized using CMP, for example. Direct contact holes 126h may be formed using a photolithography etching process. Direct contact holes 126h may be filled to form contact plugs 126 which make contact between buried signal lines 124 and upper signal lines 140 in peripheral region in an exemplary embodiment.

A barrier metal layer, such as a titanium or a titanium nitride layer, for example, may be deposited over the entire surface of insulation layer 130 to cover the direct contact holes 126h. Thereafter, a layer of material for forming upper signal lines 140, such as tungsten, cobalt, nickel, and/or titanium, may be deposited on insulation layer 130 to a thickness that ensures direct contact holes 126h are filled. After depositing a layer of upper bit line material, upper bit lines 140 contact plugs 126 may be formed by patterning and removing barrier metal layer and upper bit line material, using a photolithography process. In an exemplary embodiment in accordance with principles of inventive concepts, contact plugs 126 and upper signal lines 140 may be formed using separate deposition and photolithography processes, for example.

Figure 4B:
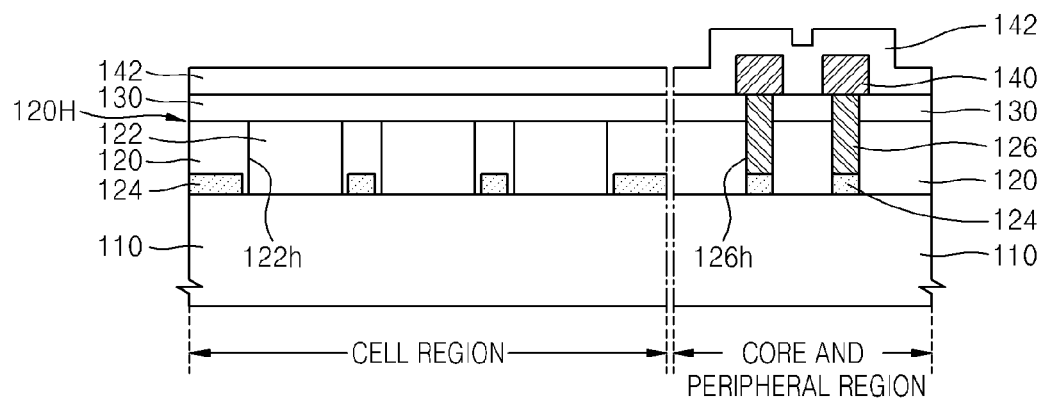

After filling direct contact holes 126h (with barrier metal material, for example) to form contact plugs 126 and patterning deposited bit line material to form upper signal lines 140, a capping layer 142 may be deposited on insulation layer 130, as illustrated in an exemplary embodiment according to inventive concepts of FIG. 4B. Capping layer 142 may include an oxide or a nitride such as silicon nitride, for example. Capping layer material may be deposited to a thickness that ensures no void, or crease, is established in the capping insulation. That is, a void, or crease, may be formed in capping insulation between upper signal lines 140 if insufficient capping insulation material were to be deposited on insulation layer 130. In an exemplary embodiment in accordance with inventive concepts, capping material is deposited to a thickness that is greater than or equal to half the distance between upper signal lines 140, thereby ensuring that the gap between upper signal lines 140 is filled with capping insulation material.

Figure 4C:
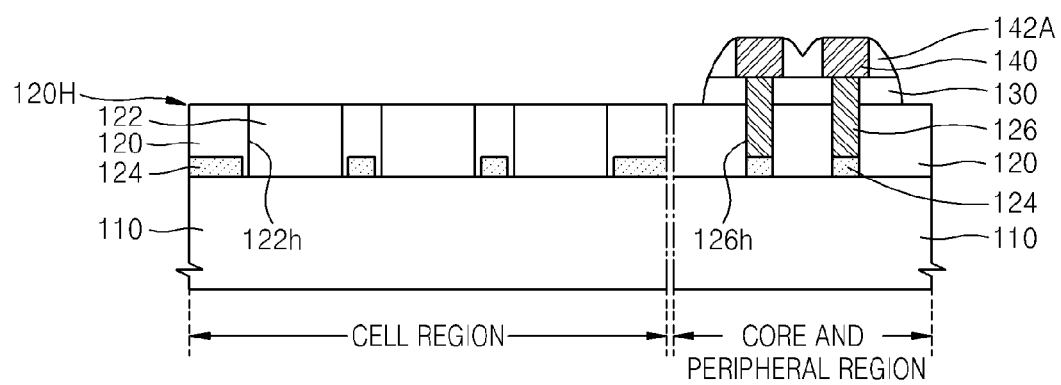

In a method in accordance with inventive principles, an etching process, which may be a dry etching process, may be performed after depositing capping layer 142. In exemplary embodiments, as illustrated in FIG. 4C, the etching process may remove capping layer 142 and insulation layer 130, thereby exposing the top of lower layer 120 in the cell region and in areas of the peripheral region not shielded by upper signal lines 140 and associated insulation layer 130 and capping layer 142. In the exemplary embodiment of FIG. 4C, the etching process forms spacers 142A along the sidewalls of upper signal lines 140. By etching away insulation layer 130 and capping layer 142 from a cell region, including the region encompassing buried contact areas, in one step, a process in accordance with inventive principles avoids the introduction of a second process step for exposing cell regions for subsequent processing. Additionally, the etching process reduces the step height between a cell region and a peripheral and core regions, at least in part, because upper signal lines 140 are formed atop insulation 130 and capping layer 142, while storage electrodes 152 are formed at a lower level, atop lower layer 120.

Figure 4D:
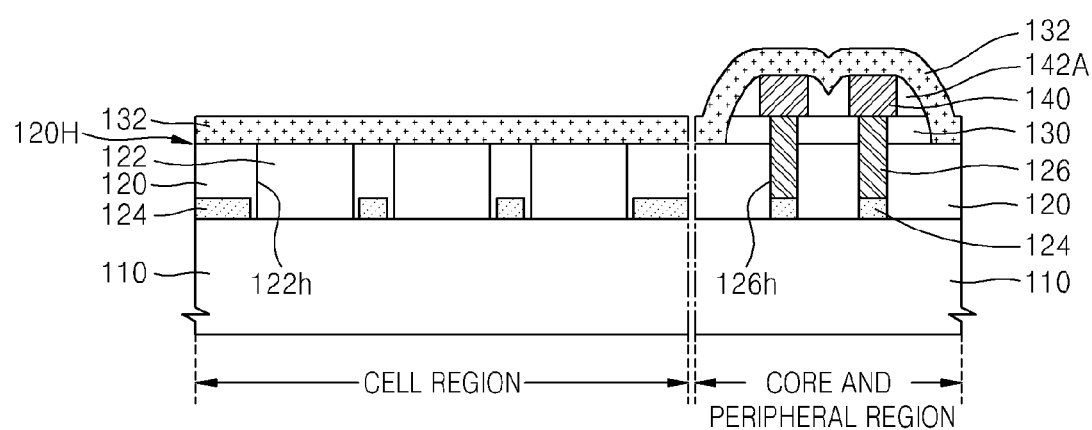

Referring to FIG. 4D, etch stop layer 132 may be formed on top of the entire surface of a wafer, including lower layer 120 and the peripheral region. Etch stop layer 132 may include silicon nitride and may be formed by using a chemical vapor deposition (CVD) process, for example. Etch stop layer 132 may prevent damage to upper signal lines 140 while forming a capacitors 150 in a cell region of a memory, for example.

Figure 4E:
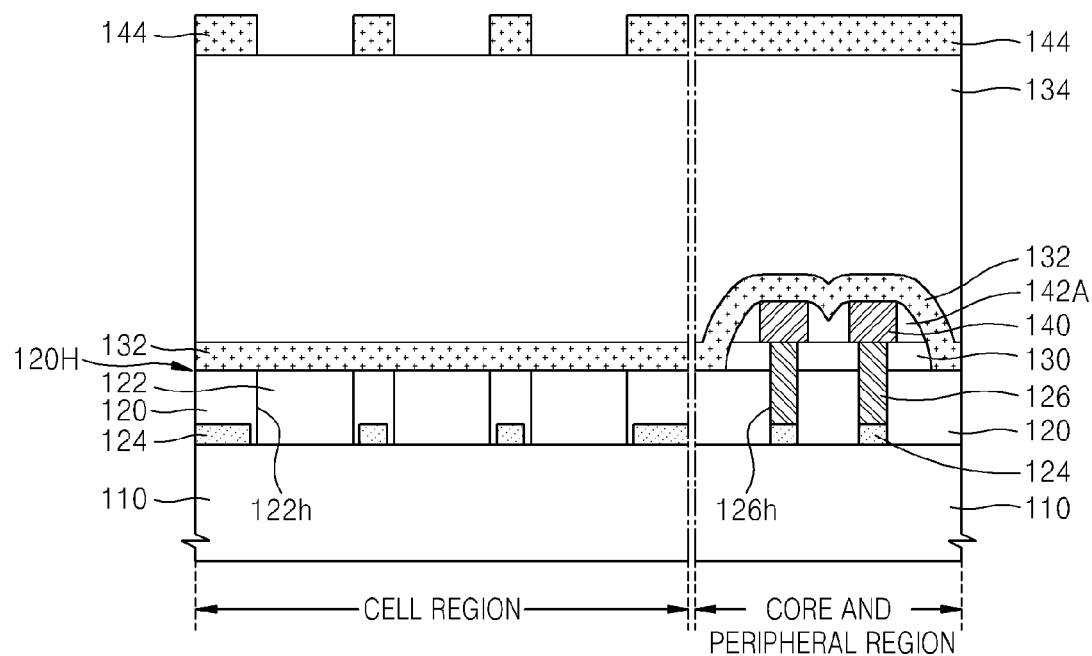

In an exemplary embodiment in accordance with inventive concepts, an insulation mold layer 134 may be formed on etch stop layer 132 and planarized using a CMP process, for example, as illustrated in FIG. 4E. Insulation mold layer may include a plurality of layers and may include a material, such as tetra ethyl ortho silicate (TEOS) film or a high density plasma (HDP) oxide film, that has an etching selection ratio higher than etch stop layer 132. After planarization of insulation mold layer 134, a mask pattern 144, photolithographically formed, defines locations of storage electrodes 152'.

Figure 4F:
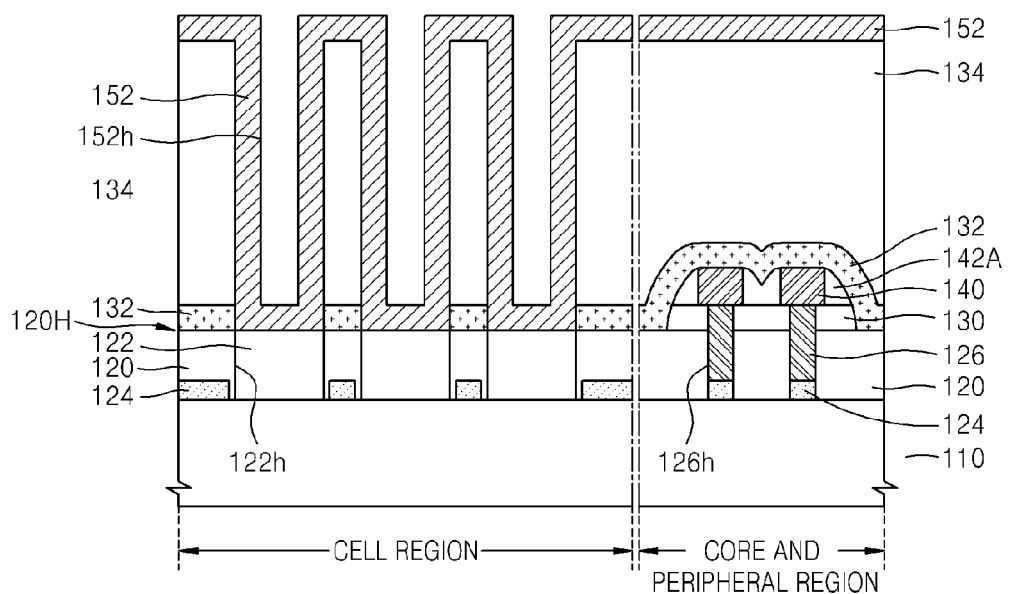

As illustrated in exemplary embodiment of FIG. 4F, storage electrode contact holes 152h are formed by etching insulation mold layer 134 material and the etch stop layer 132 material, using mask pattern 144 as an etch mask. Upper surfaces of buried contacts 122 are exposed during formation of storage electrode contact holes 152h, using an etching process that may be continuous or discontinuous and may employ wet or dry etching techniques, for example. After removing the mask pattern 144 using, for example, a strip process, an ashing process, and then washing the storage electrode contact holes 152h, a storage electrode material 152 is formed to a predetermined thickness on a wafer including cell and peripheral regions, and including sidewalls of storage electrode contact holes 152h. Storage electrode material may be a material such as titanium (Ti), titanium nitride (TiN), tantalryum nitride (TaN), platinum (Pt), tungsten (W), polysilicon (Poly-Si), or silicon germanium (SiGe), for example. The thickness of the storage electrode material layer is limited to retain open volume within storage electrode contact holes 152h. That is, although storage electrode material 152 forms on the sidewalls and bottom of storage electrode contact holes 152h, the thickness of the material is insufficient to fill the holes 152h.

Figure 4G:
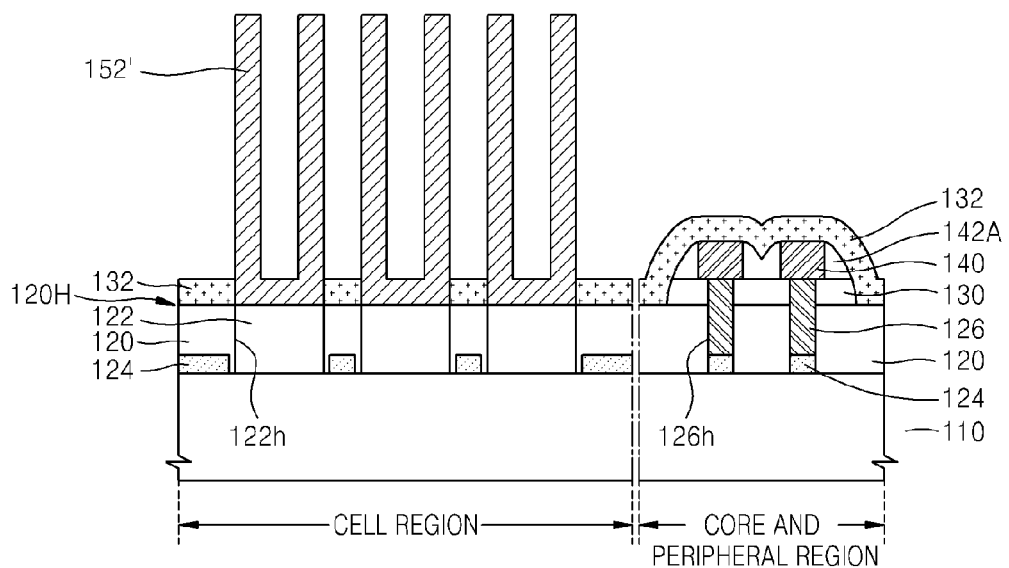

As illustrated in the exemplary embodiment of FIG. 4G, a CMP process removes the top layer of storage electrode material 152 from the semiconductor wafer, then exposed insulation mold layer 134 is removed to form storage electrode nodes 152.' Capacitors 150 (shown in FIG. 3) are then formed by forming a capacitor dielectric film 154 and plate electrode 156 on the surface of the exposed storage electrode 152'. Although a concave-shaped storage electrode 152' is illustrated, a pillar-shaped storage electrode may also be formed in accordance with inventive principles, when, for example, electrode contact holes 152h are fully buried.

Figure 5:
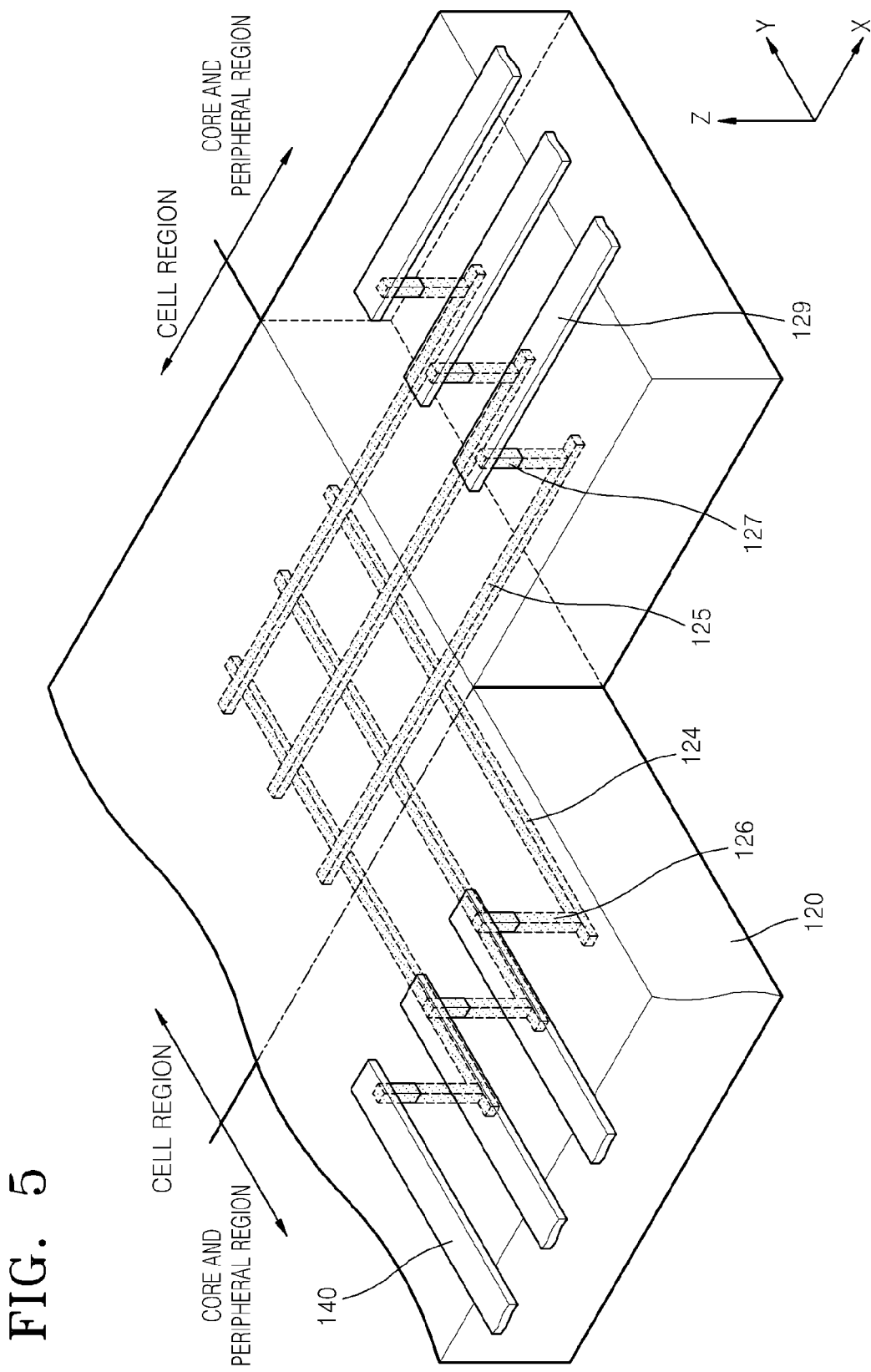
FIG. 5 is a perspective view illustrating an arrangement of bit lines and word lines in accordance with principles of inventive concepts.

FIG. 5 is a perspective view illustrating an arrangement of bit lines and word lines according to another embodiment of the inventive concept, and illustrates a diagram in which a disposition (i.e., "A" of FIG. 1A) of the bit lines shown in FIG. 2 and a disposition (i.e., "B" of FIG. 1A) of the word lines are combined. Accordingly, like elements as those of FIG. 2 use like reference numerals and like symbols, and a detailed description thereof will be omitted here.

In the exemplary embodiment of FIG. 5, a lower layer 120 extends throughout a cell region and a peripheral region. Buried signal lines 125, 124 are formed, spaced-apart and in parallel in X and Y directions and extend from cell region into peripheral region. In an exemplary embodiment of FIG. 5, signal lines extending in the X direction represent word lines and signal lines extending in the Y direction represent the bit lines. Cell array buried signal lines 124 and 125 extend into the peripheral region by a predetermined length beyond the cell region, and are electrically connected to upper signal lines 140 and 129 through contact plugs 126 and 127 formed in the peripheral region. The cell array buried signal lines 125, which are the word lines, are connected to gates (not shown) of a plurality of cell transistors disposed in cell region, and cell array buried signal lines 124, which are the bit lines, are connected to sources/drains (not shown) of the plurality of cell transistors. Buried bit lines and word lines are isolated from each other in the cell region and may be formed in lower layer 120 or in semiconductor substrate 110 (refer to FIG. 3), for example.

Figure 6:
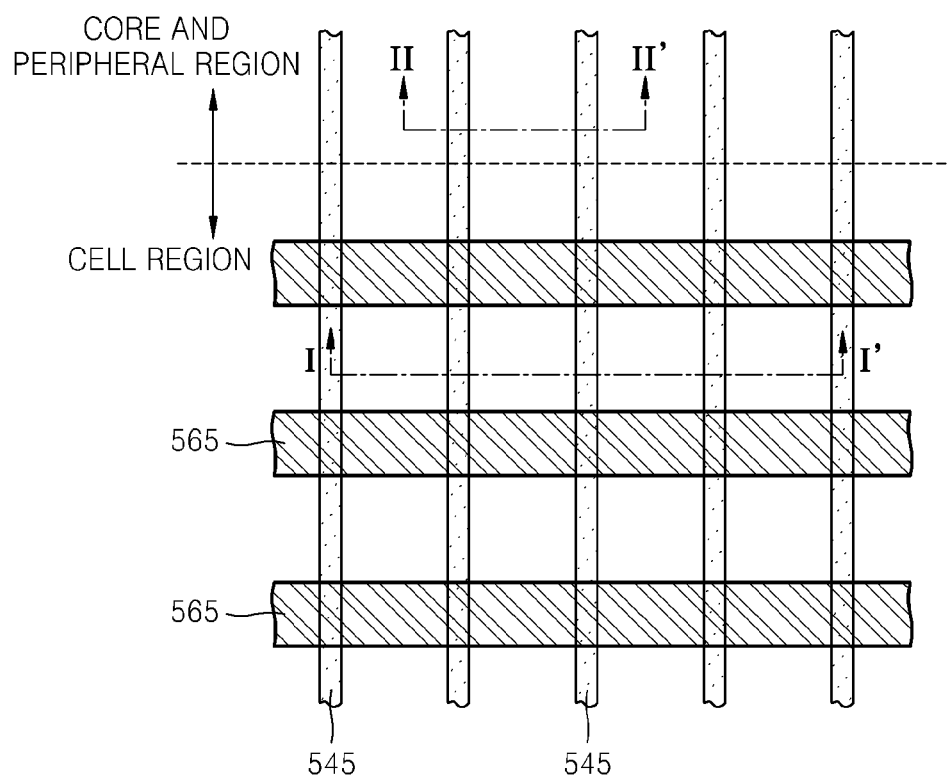
FIG. 6 is a plan view illustrating a semiconductor memory device fabricated in accordance with principles of inventive concepts.
Figure 7A:
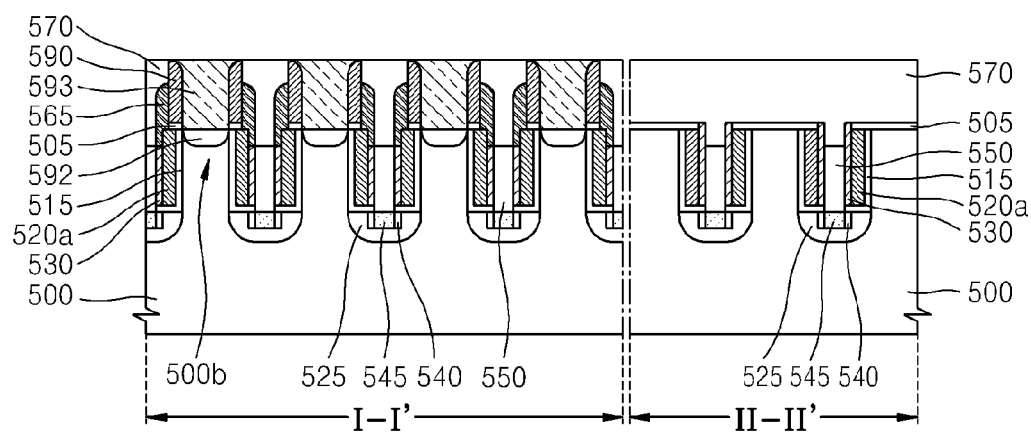
FIG. 7A and FIG. 7B are cross-sectional views illustrating a semiconductor memory device fabricated in accordance with principles of inventive concepts.
Figure 7B:
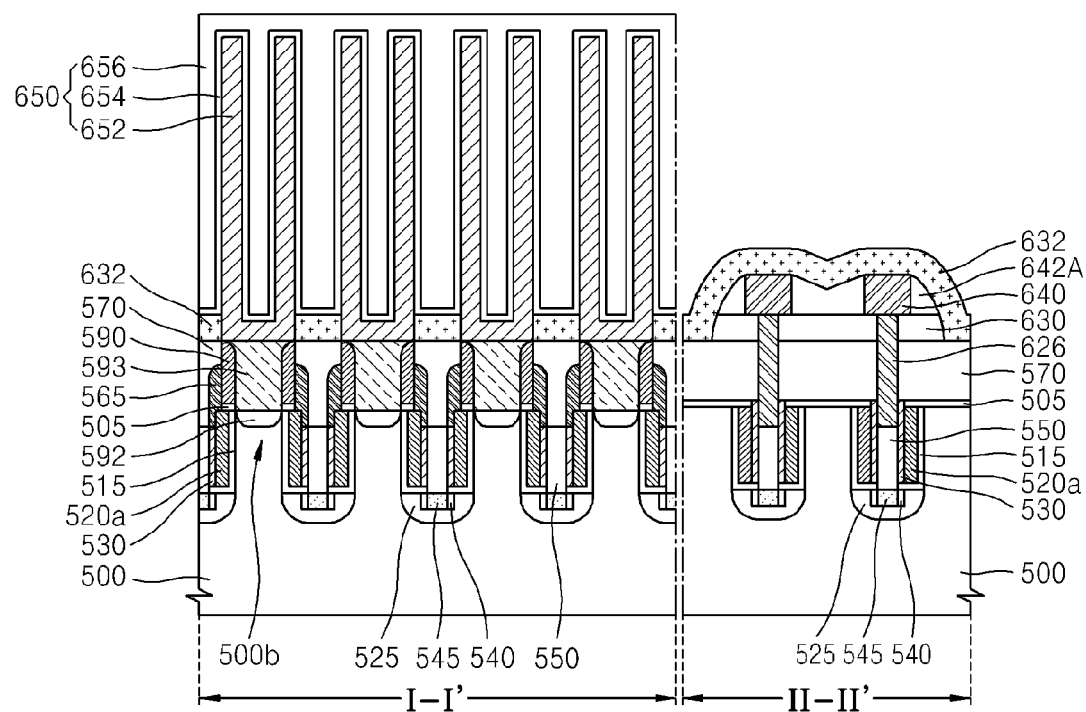

FIG. 6 is a plan view illustrating a semiconductor memory device fabricated according to another exemplary embodiment in accordance with principles of inventive concepts. FIG. 7A and FIG. 7B are cross-sectional views illustrating a semiconductor memory device fabricated according to another exemplary embodiment in accordance with principles of inventive concepts and illustrating a method of fabricating the semiconductor memory device. In these exemplary embodiments, bit lines are buried in a semiconductor substrate, and word lines are buried in an interlayer insulation layer formed on a semiconductor substrate. Left sides of FIGS. 7A and 7B are cross sectional perspective views taken along line I-I' of FIG. 6, and right sides of FIGS. 7A and 7B are cross sectional perspective views taken along line II-II' of FIG. 6.

FIG. 6 is a plan view illustrating a disposition in which word lines 565 and the bit lines 545 are formed subsequently in a cell region, the line I-I' illustrates a location between the word lines 565 in the cell region, and the line II-II' illustrates a location between the bit lines 545 in the peripheral region.

In an exemplary embodiment in accordance with principles of inventive concepts, as illustrated in FIG. 7A, a pad oxide film 505 may be formed on a semiconductor substrate 500, and a hard mask film (not shown) may be formed on pad oxide film 505. Next, a plurality of pillars 500b may be formed in a semiconductor substrate 500 by etching the semiconductor substrate 500 to a predetermined depth, using the hard mask film as an etching mask, for example. The widths of the plurality of pillars 500*b* may be reduced by performing dry or wet etching on the plurality of pillars 500*b*, for example. A gate dielectric film 515 may be formed on surfaces of the exposed semiconductor substrate 500 and the pillars 500*b*, and gate electrode material 520 may be foamed on the gate dielectric film 515. Gate electrodes 520*a* surrounding the pillars 500*b* may be formed by etching gate electrode material 520, using gate dielectric film 515 as an etch blocking film, for example.

Next, sources/drains 525 may be formed by implanting impurity ions in the semiconductor substrate 500 exposed between the pillars 500*b*. An insulation film 530 may be formed on the surface of the semiconductor substrate 500 in which the sources/drains 525 are formed, then recess parts, also referred to herein as trenches, formed in the exposed semiconductor substrate 500 using the insulation film 530 as a mask, for example. Recess parts are formed to a greater depth than the depth of the sources/drains 525. Recess parts are spaces in which the bit lines 545 are formed, and the bit lines 545 and the gate electrodes 520*a* are insulated from each other by forming insulation film 530 on side walls of the trenches. The trenches in which the bit lines are formed, also extend into the peripheral region as shown in the right sides of FIGS. 7A and 7B.

Bit lines 545 may be formed by filling in trenches with metal material such as cobalt or titanium, for example. A first interlayer insulation film 550 may fill in spaces on bit lines 545 defined by a hard mask film, that is. First interlayer insulation film 550 may be etched to a predetermined depth using the hard mask film as a mask. Conductive spacers 565 may then be formed. In areas where bit lines are formed, first interlayer insulation film 550 may remain unetched by using a dummy pattern (not shown) separately. A second interlayer insulation film 570 may fill in spaces where the conductive spacers 565 are formed, and then planarization may be performed on a surface of the second interlayer insulation film 570.

At this point, part of the hard mask film may be removed by etching. Insulation spacers 590 may then be formed on sidewalls of spaces where the hard mask film is removed, and upper sources/drains 592 may be formed by doping impurity layers in upper parts of the pillars 500*b*. Buried contacts 593 may then be formed of a poly-silicon doped with impurities, for example.

In and exemplary embodiment in accordance with inventive concepts depicted in FIG. 7B, a process similar to that of FIGS. 4A through 4G is applied to a surface of the semiconductor substrate 500 in which the second interlayer insulation film 570 is formed. A detailed description of like or similar elements will be omitted here. The left side (refer to I-I') of FIG. 7B corresponds to the cell region, and the right side (refer to II-II') of FIG. 7B corresponds to the peripheral region.

After planarizing second interlayer insulation film 570, an insulation layer 630 may be deposited on the surface of the second interlayer insulation film 570. The insulation layer 630 may then be planarized, using CMP, for example. Next, direct contact holes may be formed using a photolithography/etching process to form contact plugs 626 in peripheral region.

Subsequently, titanium or titanium nitride may be formed as a barrier metal material on the surface of the insulation layer 630 to cover the direct contact holes in which the contact plugs 626 are formed. Thereafter, the direct contact holes may be filled by depositing a metal material such as tungsten, and the contact plugs 626 are finished with a CMP, for example. Then, a metal conductive material may be deposited on the surface of the insulation layer 630 in which the contact plugs 626 are formed. Core and peripheral bit lines 640 connected to contact plugs 626 are then formed by patterning the metal conductive material. A capping layer 642 may be formed to a predetermined thickness on the insulation layer (not shown) of the cell region and the insulation layer 630 on which the core and peripheral bit lines 640 are formed.

Second interlayer insulation layer 570 of the cell region may then be exposed by etching the capping layer 642. Spacers 642A are formed in side walls of the core and peripheral bit lines 640 during a process of exposing the second interlayer insulation layer 570 of the cell region. The capping layer 642 and the insulation layer 630 are removed and thus, do not remain on the second interlayer insulation layer 570 of the cell region through the etch process.

A etch stop 632 may be formed on the second interlayer insulation layer 570 of the cell region and on the entire surface of the peripheral region. The etch stop 632 may be a silicon nitride material and may be formed using a CVD process, for example.

An insulation mold layer (not shown) may then be thickly formed on the surface of the semiconductor substrate 500 upon which the etch stop 632 is formed. The insulation mold layer may then be planarized. Thereafter, a capacitor 650 may be formed by forming storage electrodes 652, the nodes of which are separated from one another, a capacitor dielectric film 654, and a plate electrode 656, by the fabricating process as mentioned above, for example.

Figure 8A:
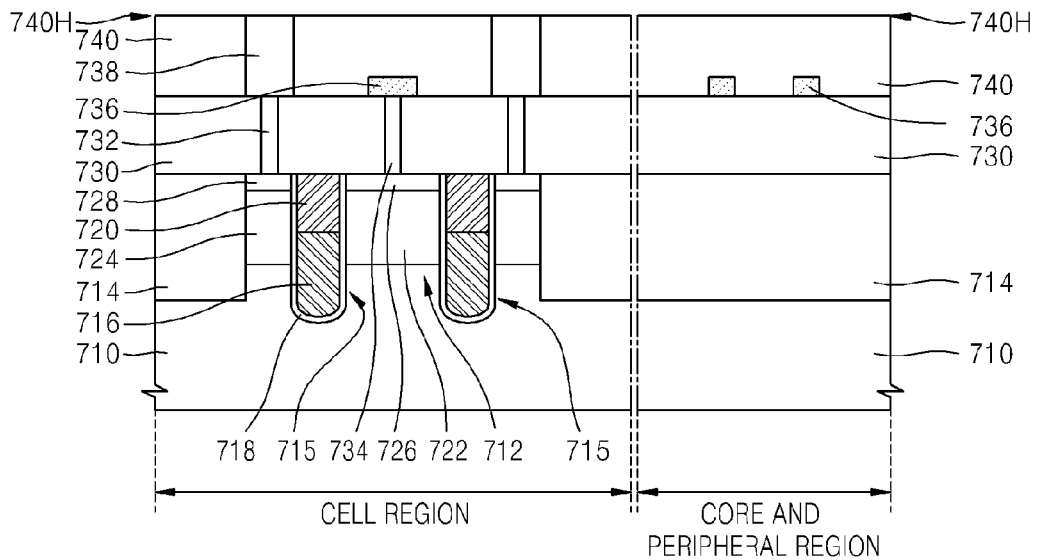
FIGS. 8A and 8B are cross sectional views illustrating a semiconductor memory device fabricated in accordance with principles of inventive concepts.
Figure 8B:
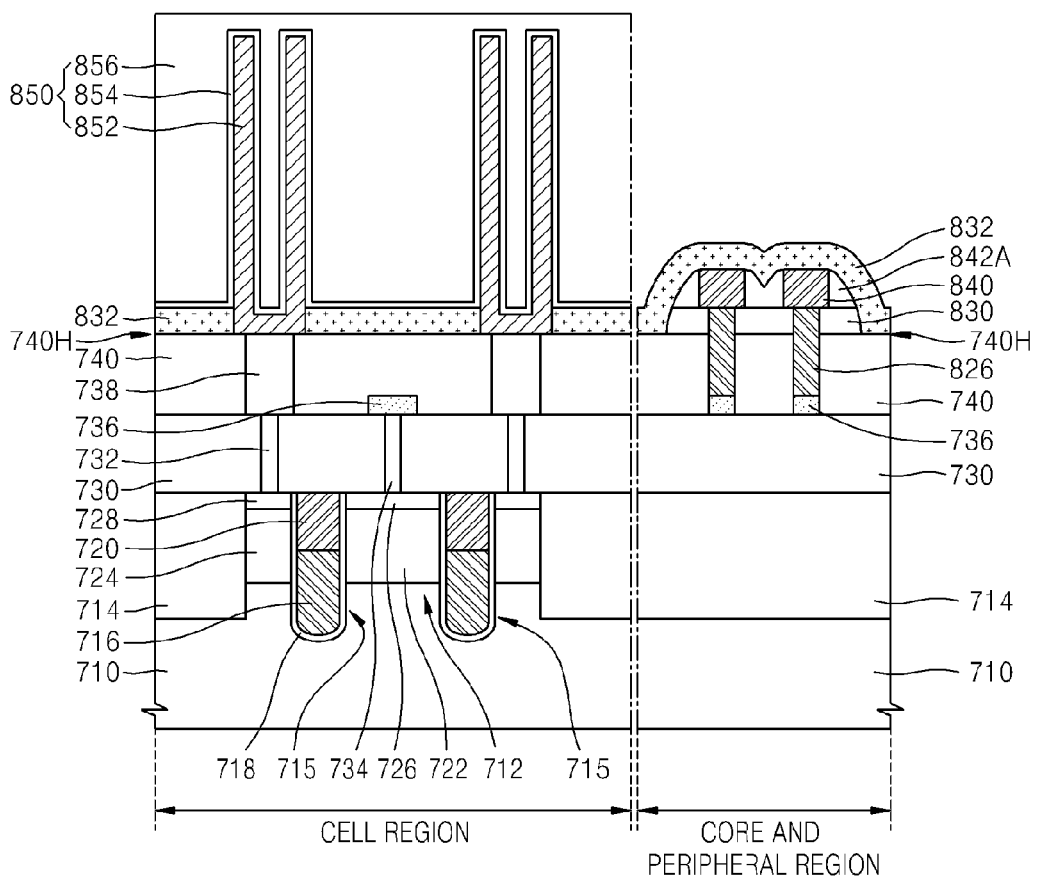

FIGS. 8A and 8B are cross-sectional views illustrating a semiconductor memory device fabricated according to another exemplary embodiment in accordance with principles of inventive concepts. In this exemplary embodiment, word lines may be buried in a semiconductor substrate, and bit lines may be buried in an interlayer insulation layer formed on the semiconductor substrate. Left sides of FIGS. 8A and 8B illustrate the cell region, and right sides of FIGS. 8A and 8B illustrate the peripheral region.

In an exemplary embodiment illustrated in FIG. 8A, an active region 712 may be defined by isolation regions 714 in a semiconductor substrate 710. Gate trenches 715 may be formed in a predetermined region of the active region 712. Gate electrodes 716 and protective film patterns 720 may be formed in the gate trenches 715, and gate insulation layers 718 may be formed between the gate electrodes 716 and the semiconductor substrate 710. Sources/drains 722 and 724 may be formed in both sides of the gate electrodes 716.

A first interlayer insulation layer 730 and a second interlayer insulation layer 740 may be sequentially formed on semiconductor substrate 710. A cell array bit line 736 may be formed on the first interlayer insulation layer 730. A cell array bit line 736 may be electrically connected to sources/drains 722 through a contact plug 734 passing through the first interlayer insulation layer 730. In an exemplary embodiment, cell array bit line 736 extends into peripheral region by a predetermined length.

As previously indicated, second interlayer insulation layer 740 may be formed on first interlayer insulation layer 730 in which the cell array bit line 736 is formed. Buried contacts 738, which are electrically connected to a storage electrode of a capacitor, may be formed in the second interlayer insulation layer 740 of the cell region, and the cell array bit line 736 may extend into peripheral region by the predetermined length.

Referring to FIG. 8B, a process similar to that of FIGS. 4A through 4G is applied to the surface of the semiconductor substrate 710 in which the second interlayer insulation layer 740 is formed. A detailed description for like or similar elements will be omitted here.

In a cell region, a capacitor 850 may be formed on buried contacts 738 of the second interlayer insulation layer 740 after planarization of second interlayer insulation layer 740. Capacitor 850 includes a storage electrode 852, a capacitor dielectric film 854, and a plate electrode 756. An etch stop 832 is formed to surround the capacitor 850. In a peripheral region, contact plugs 826 which are electrically connected to cell array bit lines 736, are formed by passing through the second interlayer insulation layer 740 and an insulation layer 830. Contact plugs 826 may be electrically connected to core and peripheral bit lines 840. Spacers 842A may be formed in side walls of the core and peripheral bit lines 840, and a etch stop 832 may be formed on the surface of the core and peripheral bit lines 840.

Figure 9A:
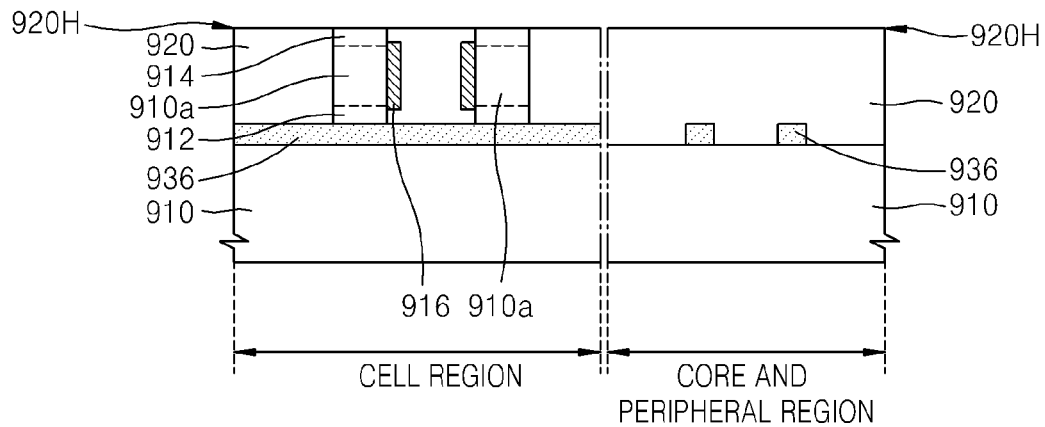
FIGS. 9A and 9B are cross sectional views illustrating a semiconductor memory device fabricated in accordance with principles of inventive concepts.
Figure 9B:
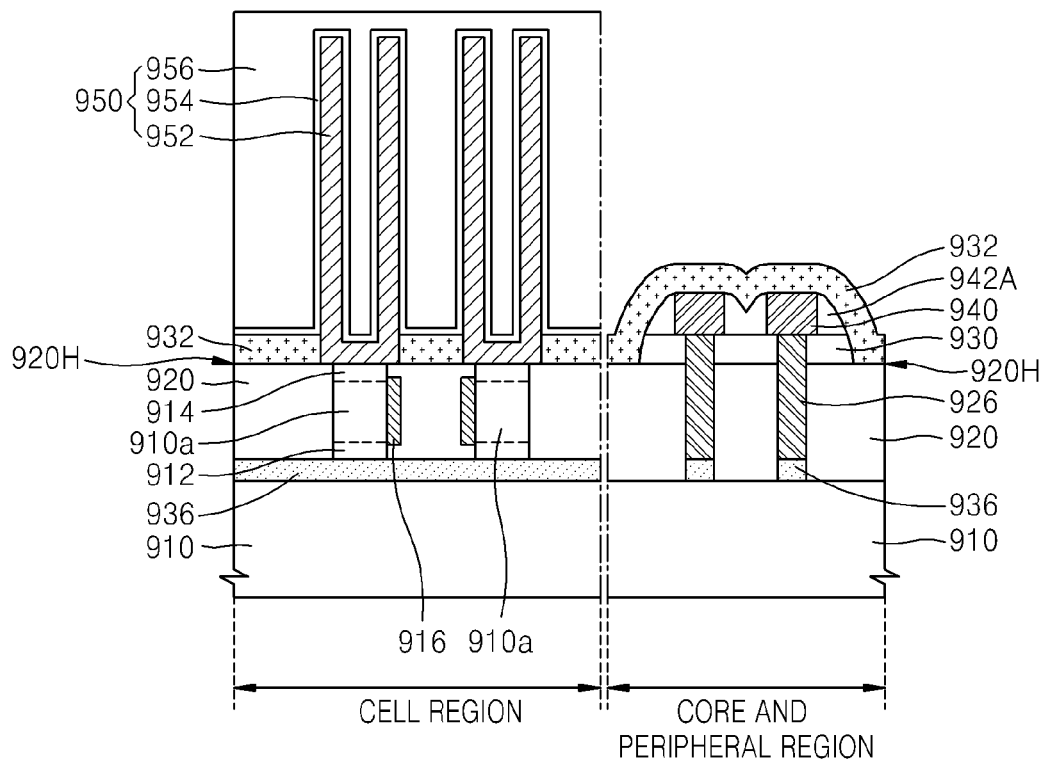

FIGS. 9A and 9B are cross-sectional views illustrating a semiconductor memory device fabricated according to another exemplary embodiment in accordance with principles of inventive concepts. They illustrate a method in accordance with principles of inventive concepts of fabricating a semiconductor memory device. In this exemplary embodiment, both bit lines and word lines may be buried in a semiconductor substrate. Left sides of FIGS. 9A and 9B illustrate a cell region, and right sides of FIGS. 9A and 9B illustrate a peripheral region.

Referring to FIG. 9A, in a cell region, active regions 910a are formed as a pillar shape in a semiconductor substrate 910. A buried insulation layer 920 may be formed to surround active regions 910a. Sources/drains 912 and 914, which may be formed by implanting impurities, for example, may be formed in upper and lower portions of active regions 910a. Sources/drains 912, 914 may be stacked vertically. Gate electrodes 916 may be formed by interposing a gate insulation layer (not shown) between the active regions 910a and the gate electrodes 916, for example. Gate electrodes 916 may be electrically connected to word lines (not shown). The sources/drains 912 formed in the lower portions of the active regions 910a may be connected to a cell array bit line 936 which is buried on the semiconductor substrate 910.

In a peripheral region, buried insulation layer 920 may be formed on an upper surface of semiconductor substrate 910. Cell array bit line 936 may extend into buried insulation layer 920.

Referring to FIG. 9B, a process similar to that of FIGS. 4A through 4G is applied to a surface of semiconductor substrate 910 in which the buried insulation layer 920 is formed on an upper surface of semiconductor substrate 910. A detailed description for like or similar elements will be omitted here.

In a cell region, a capacitor 950 may be formed on sources/drains 914 which are formed in the upper portions of the active regions 910a of the semiconductor substrate 910. Capacitor 950 includes a storage electrode 952, a capacitor dielectric film 954, and a plate electrode 956. An etch stop 932 is formed to surround the capacitor 950.

In a peripheral region, contact plugs 926, which are electrically connected to the cell array bit lines 936, may be formed by passing through the second interlayer insulation layer 920 and an insulation layer 930. Contact plugs may be electrically connected to peripheral bit lines 940. Spacers 942A may be formed on sidewalls of the core and peripheral bit lines 940. An etch stop 932 may be formed on the surface of the core and peripheral bit lines 940.

Figure 10:
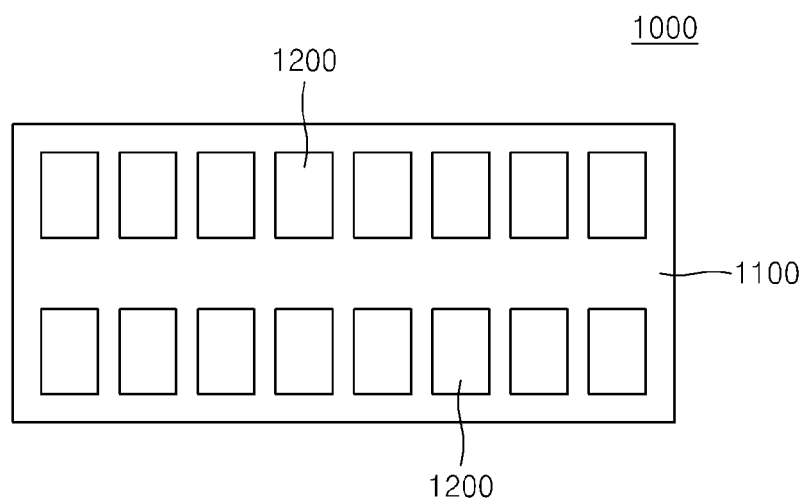
FIG. 10 is a plan view of a memory module including a semiconductor memory device in accordance with principles of inventive concepts.

FIG. 10 is a plan view of a memory module 1000 including a semiconductor memory device in accordance with principles of inventive concepts.

Referring to FIG. 10, memory module 1000 may include a printed circuit board 1100 and a plurality of semiconductor packages 1200.

The plurality of semiconductor packages 1200 may include a semiconductor memory device according to embodiments of inventive concepts. In particular, the plurality of semiconductor packages 1200 may include a distinctive structure of at least one of the semiconductor memory devices described in accordance with principles of inventive concepts.

Memory module 1000 may be a single in-line memory module (SIMM) in which the plurality of semiconductor packages 1200 are mounted only on one side of the printed circuit board 1100, or a dual in-line memory module (DIMM) in which the plurality of semiconductor packages 1200 are arranged on both sides of the printed circuit board 1100, for example.

Figure 11:
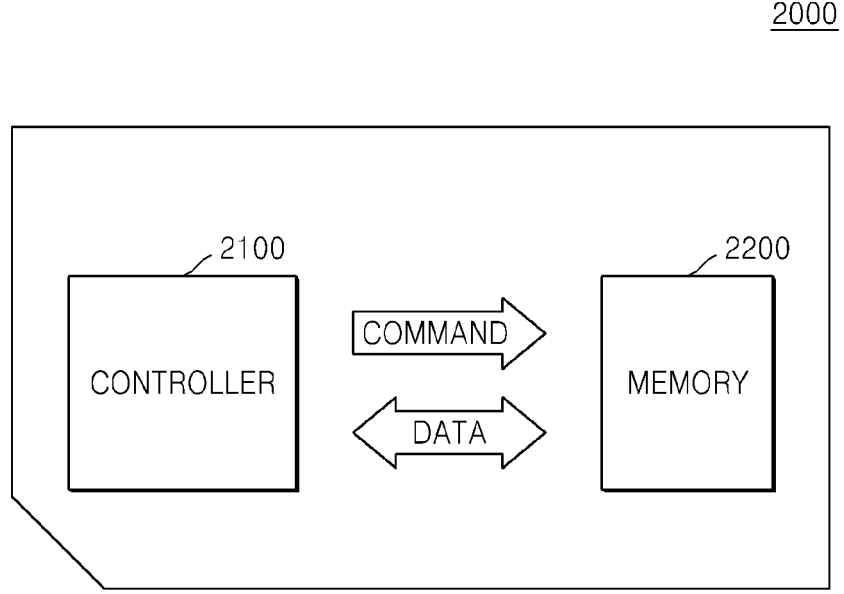
FIG. 11 illustrates a memory card including a semiconductor memory device in accordance with principles of inventive concepts.

FIG. 11 illustrates a memory card 2000 including a semiconductor memory device according to the inventive concept.

In memory card 2000, a controller 2100 and a memory 2200 may be disposed to exchange electrical signals with each other. For example, when controller 2100 issues a command to memory 2200, memory 2200 may transmit data to the controller 2100.

Memory 2200 may include a semiconductor memory device in accordance with principles of inventive concepts. In particular, memory 2200 may include a distinctive structure of at least one of a semiconductor memory device in accordance with principles of the inventive concepts.

Memory card 2000 may be configured for various uses, such as, a memory stick card, a smart media (SM) card, a secure digital (SD) card, a mini-secure digital (mini-SD) card, or a multimedia card (MMC), for example.

Figure 12:
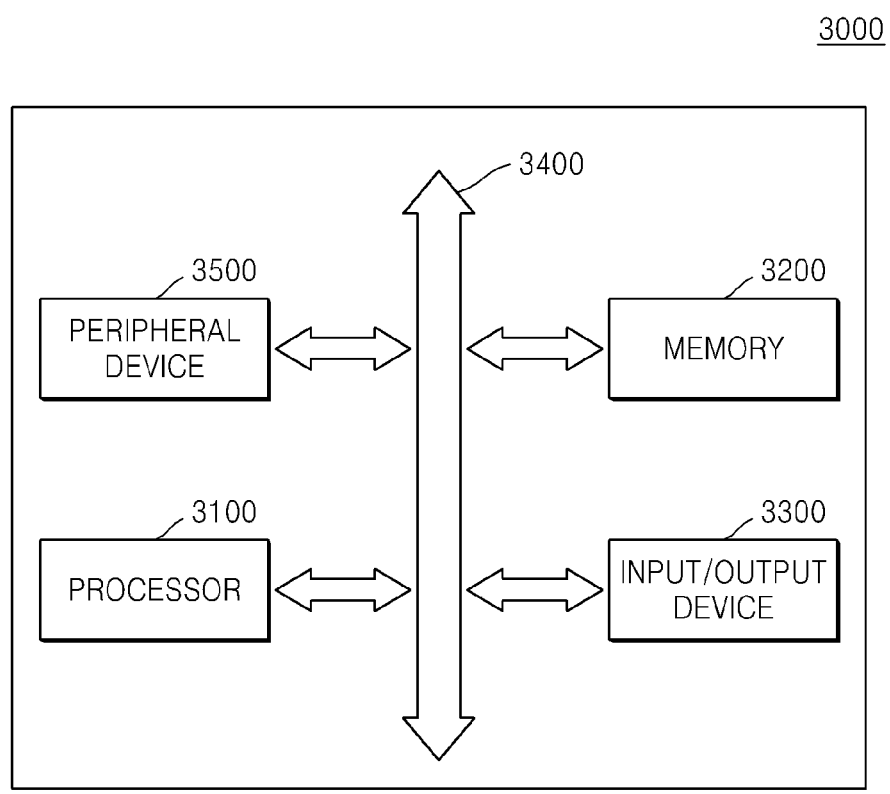
FIG. 12 is a schematic block diagram of a system including a semiconductor memory device in accordance with principles of inventive concepts.

The schematic block diagram of FIG. 12 depicts a system 3000 that includes a semiconductor memory device in accordance with principles of inventive concepts.

In system 3000, a processor 3100, a memory 3200, and an input/output device 3300 may data-communicate with each other using a bus 3400.

Memory 3200 of the system 3000 may include random access memory (RAM) and read only memory (ROM), for example. In addition, system 3000 may include a peripheral device 3500 such as a floppy disk drive and a compact disk (CD) ROM.

Memory 3200 may include a semiconductor memory device having a distinctive structure corresponding to a semiconductor memory device in accordance with principles of inventive concepts mentioned above. Memory 3200 may store codes and data for an operation of the processor 3100, for example.

System 3000 may be used in mobile phones, MP3 players, navigation devices, portable multimedia players (PMPs), solid state disks (SSDs), or household appliances.

Although inventive concepts have been particularly shown and described with reference to exemplary embodiments thereof, it will be understood by those of ordinary skill in the art that various changes in form and details may be made therein without departing from the spirit and scope of the inventive concept as defined by the following claims.

What is claimed is:

1. A method of fabricating a semiconductor memory device, the method comprising:
preparing a semiconductor substrate which is divided into a cell array region and a core and peripheral region adjacent to the cell array region and which comprises a lower layer where a cell array lower signal line and buried contact are formed in the cell array region;
forming an insulation layer on the lower layer;
forming a core and peripheral upper signal line which is electrically connected to the cell array lower signal line via a contact plug formed through the insulation layer of the core and peripheral region;

forming and patterning a capping insulation film on the insulation layer to form sidewall spacers around the upper signal lines; and forming and patterning a stopper layer to cover upper signal lines and spacers and to stop etching above lower signal lines and allow etching to open buried contacts in the cell region.

2. The method of claim 1, wherein the capping insulation film is formed to have a thickness corresponding to at least one half of an interval between the core and peripheral signal transmission conductive layer.

3. The method of claim 1, wherein the etching of the capping insulation film comprises dry etching.

4. The method of claim 1, wherein the cell array signal transmission conductive layer comprises a cell array bit line, and wherein the core and peripheral signal transmission conductive layer comprises a core and peripheral bit line.

5. The method of claim 1, wherein the cell array signal transmission conductive layer comprises a cell array word line, and wherein the core and peripheral signal transmission conductive layer comprises a core and peripheral word line.

6. The method of claim 1, wherein the forming of the core and peripheral signal transmission conductive layer comprises forming a contact plug electrically connected to the cell array signal transmission conductive layer.

7. The method of claim 1, wherein the lower layer comprises an interlayer insulation layer.

8. The method of claim 1, wherein the lower layer is formed on the semiconductor substrate.

9. The method of claim 1, wherein the lower layer is formed so that an upper surface of the lower layer has a first height level, and extends over the cell region and the core and peripheral region.

10. The method of claim 9, wherein the cell array signal transmission conductive layer is formed at a location under the first height level.

11. The method of claim 1, further comprising:

forming an insulation mold layer on the stopper layer after the forming of the stopper layer; and forming a storage electrode which is electrically connected to the lower layer by passing through the insulation mold layer and the stopper layer.

12. The method of claim 11, wherein the lower layer comprises a buried contact layer, and the storage electrode is electrically connected to the buried contact layer.

13. The method of claim 12, wherein the buried contact layer comprises poly-silicon.

14. The method of claim 11, further comprising, after the forming of the insulation mold layer, forming a photoresist pattern on the insulation mold layer before forming the storage electrode.

15. The method of claim 11, wherein the insulation mold layer comprises a material, an etching selection ratio of which is larger than that of the stopper layer.

16. A method of forming a semiconductor memory device having cell and peripheral regions, comprising:

forming an insulation layer over the cell region and the peripheral region;

forming upper signal lines on the insulation layer in the peripheral region, the upper signal lines being connected to lower signal lines formed under the insulation in the cell region;

forming a capping layer over the cell region and the peripheral region;

etching the capping layer to form spacers on sidewalls of upper signal lines and using a patterned etch stop to remove capping and insulation layers in the cell region, thereby exposing a buried contact in the cell region;

and forming a capacitor in contact with the buried contact.

17. The method of claim 16, wherein the capping layer includes a nitride.

18. The method of claim 16, wherein the capping layer includes an oxide.

19. The method of claim 16, wherein the capping layer is deposited to a thickness that is at least half the distance between upper signal lines.

20. The method of claim 16, further comprising the step of forming an etch stop layer over upper signal lines.

* * * * *